(12) United States Patent
Bernard

(10) Patent No.: US 7,734,464 B2
(45) Date of Patent: Jun. 8, 2010

(54) RF AUTOCORRELATION SIGNAL TRIGGER GENERATOR

(75) Inventor: Kyle L. Bernard, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 1090 days.

(21) Appl. No.: 11/134,216

(22) Filed: May 20, 2005

(65) Prior Publication Data

US 2006/0265213 A1 Nov. 23, 2006

(51) Int. Cl.
*G10L 19/00* (2006.01)

(52) U.S. Cl. .................. 704/216; 375/150; 375/316; 375/343; 375/354; 375/355

(58) Field of Classification Search .......... 375/150, 375/316, 343, 354, 355; 704/216
See application file for complete search history.

(56) References Cited

U.S. PATENT DOCUMENTS

| | | | |
|---|---|---|---|
| 3,621,223 A | 11/1971 | Alexeff et al. | |
| 4,403,184 A | 9/1983 | Witt et al. | |
| 4,870,348 A * | 9/1989 | Smith et al. | 324/76.19 |
| 5,465,405 A * | 11/1995 | Baseghi et al. | 455/226.4 |
| 6,047,034 A * | 4/2000 | Tsuruoka | 375/343 |
| 7,058,151 B1 | 6/2006 | Kim | |
| 7,236,554 B2 * | 6/2007 | Gupta | 375/355 |
| 2004/0042534 A1 * | 3/2004 | Raphaeli et al. | 375/150 |

* cited by examiner

*Primary Examiner*—David C Payne
*Assistant Examiner*—Leon Flores
(74) *Attorney, Agent, or Firm*—Matthew D. Rabdau; Michael A. Nelson

(57) ABSTRACT

An autocorrelation trigger comprising a correlator detector for producing a correlation coefficient by correlating a signal with a time-delayed version of the signal and generating a trigger in real-time when the correlation coefficient corresponds to a predetermined condition is provided. A method of producing trigger based upon an autocorrelation measurement is also provided. The autocorrelation trigger may be used to produce a trigger based upon the degree to which the autocorrelation relates to an autocorrelation model, such as, the degree of randomness in a signal.

7 Claims, 3 Drawing Sheets

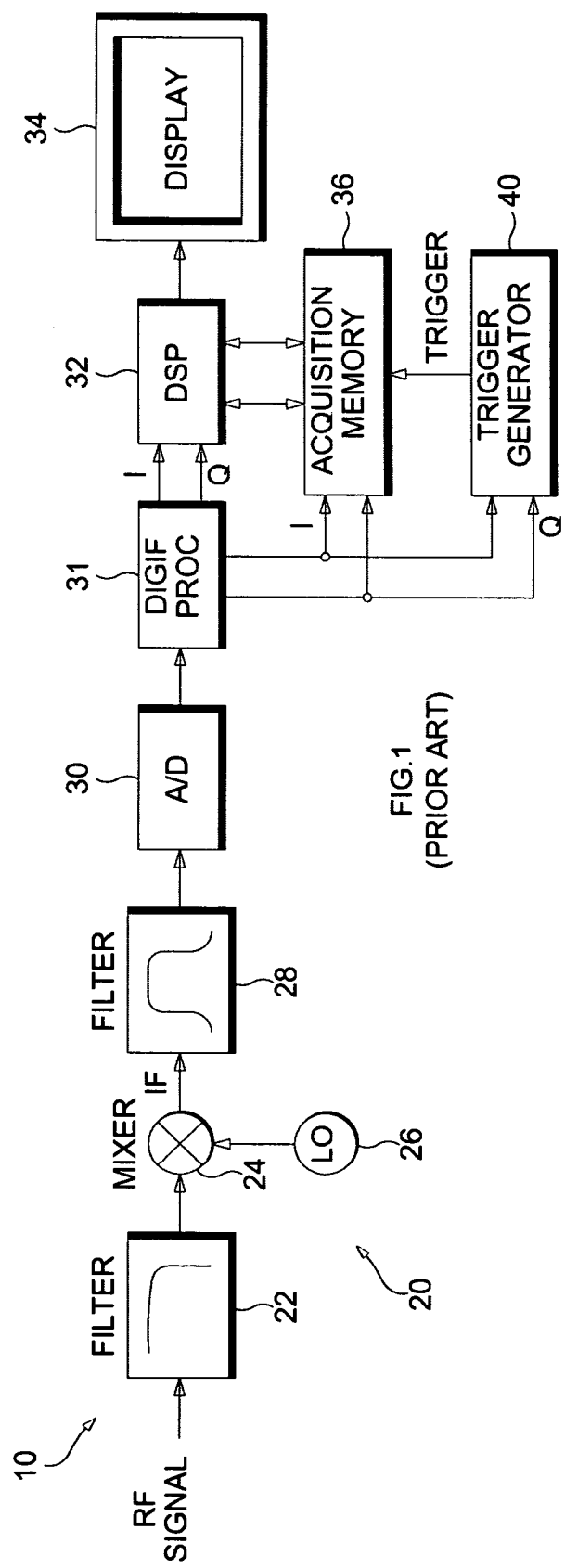
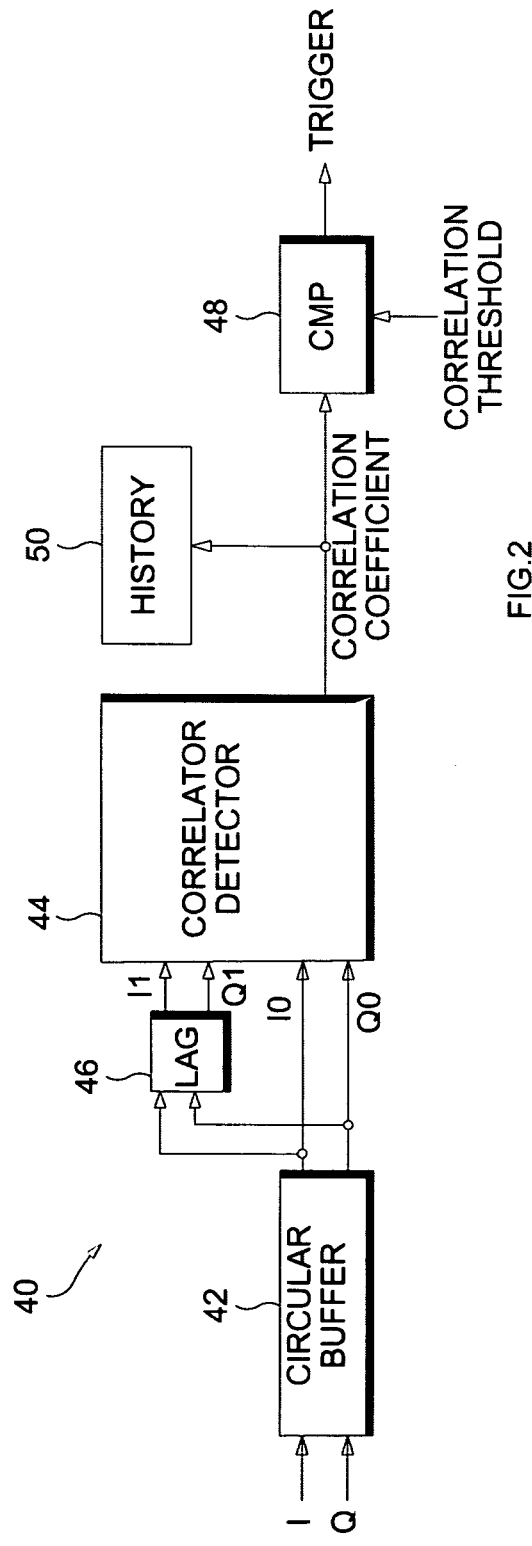
FIG.1 (PRIOR ART)
FIG.2

RF AUTOCORRELATION SIGNAL TRIGGER GENERATOR

BACKGROUND

The present invention relates generally to signal triggers, and more specifically to real-time signal triggers based on autocorrelation characteristics.

Measurement instruments, such as spectrum analyzers and oscilloscopes, have the ability to acquire and analyze data in real-time. Examples of spectrum analyzers capable of making real-time measurements include Tektronix® WCA200, WCA300, RSA2200, and RSA3300 series spectrum analyzers, which are manufactured by Tektronix, Inc. of Beaverton, Oreg. These spectrum analyzers capture and analyze seamless blocks of data.

Measurement instruments have the capability to acquire, process, and display data faster than operators can meaningfully observe the data being presented. Triggers have been used in measurement instruments to start or stop the acquisition of data. These triggers have been based on time domain information about the input signal under analysis, and provided by an external source. Internal triggers capable of triggering on frequency spectral data have been used to display accumulated spectra following detection of a predefined spectra event. For example, a frequency mask trigger calculates the signal spectrum and triggers when the calculated spectrum violates a user-defined spectrum mask. A predefined block of data is stored containing information on what happened immediately before and immediately after the triggering event so that the operator can review the data, and perform post processing, as desired.

Triggers are desired to allow a measurement instrument to trigger on a variety of additional signal characteristics.

SUMMARY

Accordingly, an autocorrelation trigger is provided. An autocorrelation trigger uses a comparison of a signal with time-delayed versions of itself to produce a correlation coefficient, or correlation series, which can be compared to a correlation threshold, or a correlation mask, to determine the presence of a condition that is of interest. When a condition of interest is present, the autocorrelation trigger produces a trigger.

An embodiment of an autocorrelation trigger is provided comprising a correlator detector for producing a correlation coefficient by correlating a signal with a time-delayed version of the signal. A lag generator provides a time-delayed version of the signal to the correlator detector to compare against the signal. A comparator connected to the correlator detector produces a trigger when the comparison of a correlation coefficient with a correlation threshold satisfies a correlation condition. In an alternative embodiment the comparator comprises a correlator that is capable of comparing a correlation series against a correlation mask to determine whether the correlation condition is satisfied and then producing a trigger.

A method of generating an autocorrelation trigger is also provided. The method comprises correlating a signal with a time-delayed version of the signal to produce a correlation coefficient. The correlation coefficient is compared with a correlation threshold to determine a correlation condition, and a trigger is generated when the correlation condition is satisfied. In an embodiment of this method, a randomness trigger is achieved by comparing the correlation coefficient to a threshold value set close to zero, and triggering when the threshold is exceeded possibly indicating the presence of a non-random signal. In an alternative embodiment, a series of correlation coefficients, also known as a correlation series, is compared with a mask comprising multiple threshold values. The correlation series may be used to detect the degree of randomness while reducing the number of false triggers, which may result from single correlation coefficient measurements. In another alternative embodiment, the correlation series can be compared against a correlation mask to determine its correlation with a desired autocorrelation model. For example, a sinusoidal model may be used to trigger on the presence, or absence, of signals that are sinusoidal in nature. In further embodiments, the autocorrelation model may be a weak autocorrelation model, or a strong autocorrelation model.

Aspects of the various embodiments of the present invention will become apparent from the following detailed description when read in conjunction with appended claims and attached drawings.

BRIEF DESCRIPTION OF THE DRAWINGS

FIG. 1 illustrates a real-time spectrum analyzer.
FIG. 2 illustrates an autocorrelation trigger.

DETAILED DESCRIPTION

Figure 3:
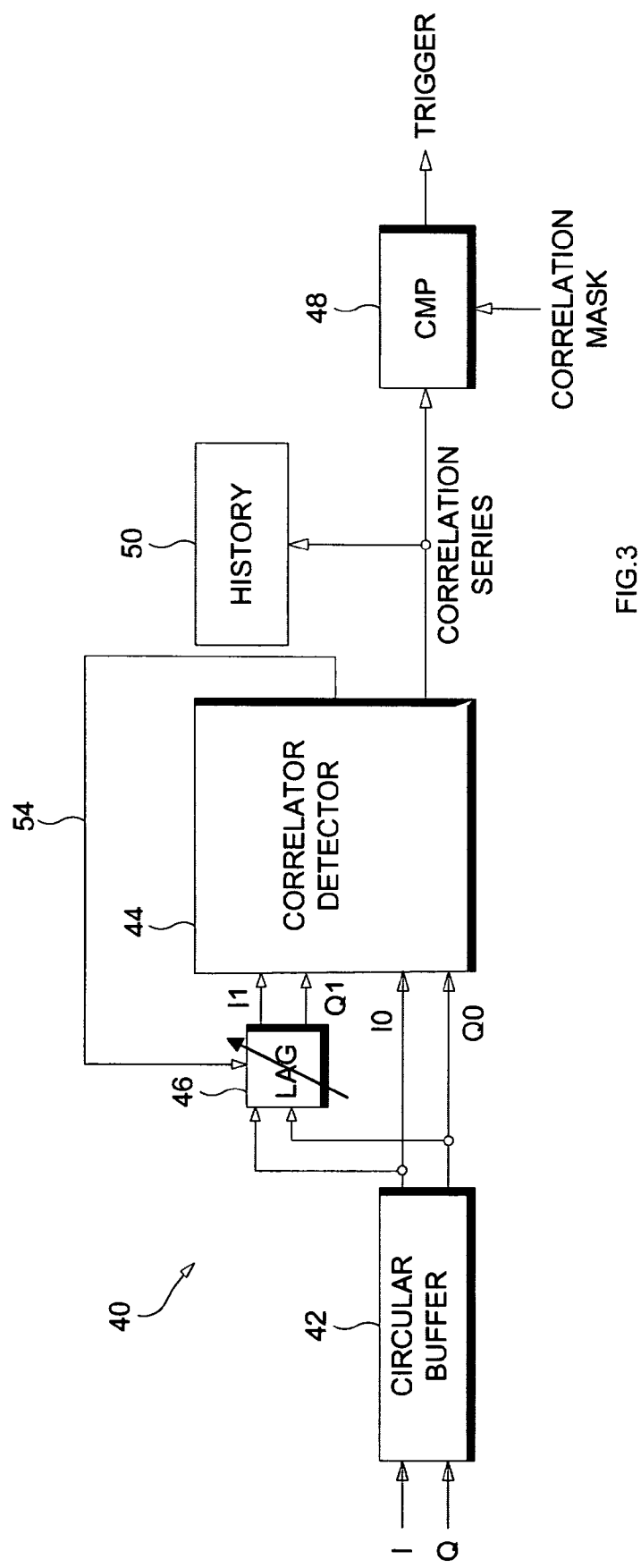
FIG. 3 illustrates an autocorrelation trigger.

Referring now to FIG. 1, a real-time spectrum analyzer 10 is shown having an input processor 20 for receiving an input RF signal, or other signal of interest. The input processor 20 typically includes a lowpass filter 22 followed by a mixer 24 that converts the filtered input signal to an intermediate frequency (IF) signal using a local oscillator 26. The IF signal is passed through a bandpass filter 28 and then input to an analog-to-digital (A/D) converter 30 to provide a digital signal for further processing. The digital signal is input to a digital IF quadrature processor 31 to derive In-phase (I) and Quadrature-phase (Q) signals from the digital signal. The I and Q signals are input to a digital signal processor (DSP) 32 for real-time processing for display on a monitor 34, which provides a three-dimensional representation of frequency vs. time vs. amplitude, also referred to as a spectrogram. The I and Q signals are also input to an acquisition memory 36 and to a trigger generator 40. When the trigger generator 40 detects an event, a trigger is generated that causes acquisition memory 36 to hold data from before and/or after the trigger event for subsequent processing. Subsequent processing may be performed by the DSP 32, or by another processor (not shown). The subsequent processing may be used for real-time analysis or non-real-time analysis.

FIG. 2 further illustrates an embodiment of the trigger generator 40. I and Q signals are input to a circular buffer 42 that provides a time segment of the received RF data (I/Q). A time segment may also be referred to as a sample, or a record. To perform an autocorrelation, the time segment is compared against a version of itself. In an embodiment of the trigger generator 40, autocorrelation is used to determine the degree of randomness of a signal. A random signal, such as that associated with white noise, should produce a correlation coefficient of 1, when it is compared with itself at lag 0, and should produce a correlation coefficient approaching 0, when it is compared with any time-shifted version of itself, corresponding to lag 1 through lag n. To determine a degree of randomness using the trigger generator 40, a real-time comparison of active signals is performed against a time delayed version of the active signals. In an embodiment of the present trigger, this is accomplished by providing at least two sets of I and Q to a correlator detector 44. A first set of I and Q, noted as I0 and Q0, are input from the circular buffer 42. A second set of I and Q, noted as I1 and Q1, are input from the circular buffer 42 after passing through a lag 46, which provides a time-delayed version of I and Q relative to I0 and Q0. The amount of lag is either predetermined during manufacture of the trigger generator 40, or set by the operator in the field. Since the correlation coefficient should be approximately 0 for any non-zero lag, any suitable lag value may be used, for example lag 1. It should be understood that both signals could be delayed by different amounts and still correspond to a similar relative lag as that provided by only applying a lag to a single path. The amount of lag refers generally to any amount of time shifting, although in practice each lag may correspond to a shift of one sample point. In some embodiments, the trigger generator 40 is implemented using an FPGA, or an ASIC. In these embodiments the lag may be implemented using a shift register incorporated into the FPGA or ASIC. In other embodiments the lag may be accomplished using software running on a CPU, or other general purpose processor, or by a digital signal processor (DSP).

The correlator detector 44 performs any necessary calculations to produce a correlation coefficient (CC). Autocorrelation coefficients typically range from −1 to 1, however within a digital system this range may be expressed by any suitable means. The correlator detector 44 is implemented using any suitable means for calculating the correlation coefficient within the time allowed. In the case of a real-time trigger, the correlator detector 44 will be implemented using any circuit, or component, capable of completing the necessary calculations within the time allowed by the sampling rate of the instrument. A real-time trigger will preferably complete the trigger determination before the next set of samples is available to the circular buffer 42. This will allow the trigger operation to continue in real-time without missing any samples. In some applications, some sample loss may be acceptable. Although sample loss is generally undesirable, these applications may still be served using an autocorrelation trigger as generally provided here. In an embodiment of the present trigger, the correlator detector is implemented using a field programmable gate array (FPGA). In alternative embodiments, the correlator detector 44 is implemented using an ASIC. In other alternative embodiments, software running on a CPU, or other general purpose processor, may be used provided that it is fast enough for the desired sample rate. Similarly, a DSP may be used in some embodiments provided that it is fast enough for the desired sample rate.

The correlation coefficient (CC) is continuously calculated in real-time and output to indicate the degree of correlation of the RF/IF data with a time-delayed version of itself. The correlation coefficient is input to a comparator 48 for comparison with a correlation threshold. In an embodiment of the present trigger, a simple comparator circuit for comparing a single correlation coefficient to a threshold value is used for the comparator 48. The value of the correlation threshold depends upon the degree of correlation desired in order to define a trigger event. The correlation threshold may be preset by the manufacturer or selected by the end-user. In an embodiment of the present trigger, the trigger event is defined to cause a trigger when the correlation coefficient exceeds the value of the correlation threshold. For example, the correlation coefficient (CC) calculated from a signal compared to a delayed version of itself should be very close to zero for a random signal. If the correlation coefficient (CC) exceeds the value of the correlation threshold, which would be set to a tolerance on either side of zero, it would indicate the presence of a non-random signal. The comparator 48 would then produce a trigger. The trigger would then cause the acquisition memory 36 to hold information related to the signal. The acquisition memory 36 can be set to hold information related to the signal from before the trigger, during the trigger, after the trigger, or any combination thereof. The value of the correlation threshold can be selected to balance the need to identify non-random events and avoid possible false triggers. The ability to identify randomness characteristics, and the presence of non-random signals, may be used to monitor, and identify, stealthy or unauthorized signals. For example, a quiet area of spectrum at a particular frequency may be expected to contain only random noise. When the randomness characteristic of the signal changes, it may indicate the presence of an unexpected, intermittent, or stealthy transmission. By providing an autocorrelation trigger for determining randomness, this signal can be captured for further analysis.

In an alternative embodiment, the trigger event is selected to cause a trigger when the correlation coefficient is within the value of the correlation threshold. For example, the trigger could be activated when a non-random signal changes to a random signal.

In an embodiment of the trigger generator 40, a history 50 of the correlation coefficient over time is maintained to provide data to allow the signal behavior over longer periods of time to be analyzed. In one embodiment, the history is stored within the trigger generator 40. In an alternative embodiment, the correlation coefficients are provided and stored in a history 50, which is external to the trigger generator 40.

An embodiment of an autocorrelation trigger configured to produce a correlation coefficient based upon the degree of randomness within a signal has been described. The random signal model described above is only one model that can be identified using autocorrelation. More generally, an autocorrelation trigger may be used to trigger based upon the degree to which a signal matches a particular characteristic model. While an autocorrelation trigger can be based on a single correlation coefficient to determine the degree of randomness, other models may require multiple time lags to determine the degree to which a signal matches a predefined characteristic model.

FIG. 3 illustrates an embodiment of a trigger generator 40 for providing a trigger based on an autocorrelation using multiple lags. The basic trigger is similar to that described above in connection with FIG. 2. A variable lag controllable by the trigger generator is provided. The lag 46 is now indicated as variable and controllable by the correlator detector 44 through the control path 54. The correlator detector 44 produces a correlation series, which is a series of correlation coefficients for different amounts of lag. For example, when the lag 46 provides lag 1, the correlator detector 44 will produce a correlation coefficient of CC1. The correlator detector 44 will then update the lag 46, for example to lag 2 and produce a correlation coefficient of CC2. Accordingly, the correlator detector 44 will produce a correlation series CC1, CC2, CC3, through CCN, for N different lag values. In an embodiment, the amount of lag is incremented in single steps, for example lag 1, lag 2, lag 3, etc. In an alternative embodiment, the amount of lag is incremented in non-single steps, for example lag 1, lag 3, lag 7, lag 12. The maximum amount of lag, and the number of autocorrelations that the correlator detector 44 is able to calculate is limited by the speed of the correlator detector 44 relative to the sampling rate of the instrument.

The correlation series provided by the correlator detector 44 is compared against a correlation mask by the comparator 48. In some embodiments the comparator 48 is implemented as a correlator for determining correlation of the correlation series with a correlation mask rather than a simple comparator that compares two values against each other. For example, in an embodiment of the present trigger, the comparator 48 is implemented using a field programmable gate array (FPGA). In alternative embodiments, the comparator 48 is implemented using an ASIC. In other alternative embodiments, software running on a CPU, or other general purpose processor, may be used provided that it is fast enough to for the desired sample rate. Similarly, a DSP may be used in some embodiments provided that it is fast enough for the desired sample rate.

In an embodiment of the trigger generator 40, the comparator 48 will generate a trigger when the correlation series is within a predefined correlation mask. In an alternative embodiment, the comparator 48 will generate a trigger when the correlation series exceeds the predefined correlation mask. The correlation mask can be predefined to correspond to a particular characteristic model. The degree to which this multi-lag autocorrelation shape, as represented by the correlation series, matches a predefined characteristic model is variable, and adjustable, to meet a variety of uses. A multi-lag correlation may be used for degree of randomness. In this case, a simple mask having a value of 1 at lag 0 and a threshold slightly above zero over the rest of the range may be used. In other embodiments, a multi-lag correlation may be used for determining the degree of randomness where the signal does not correspond to a white noise signal, such that it is not close to zero across all amounts of lag. Accordingly, a multi-lag randomness mask may be used to reduce false triggers which may be associated with single-lag embodiments. Additional models may be used, for example, sinusoidal signal models might be used to detect signal modulation glitches, or failures. Sinusoidal signal models might also be used to detect the presence of sinusoidal signals where none should be. In other embodiments, the correlation mask can be set to correspond to any desired weak, or strong, autocorrelation model.

Figure 4:
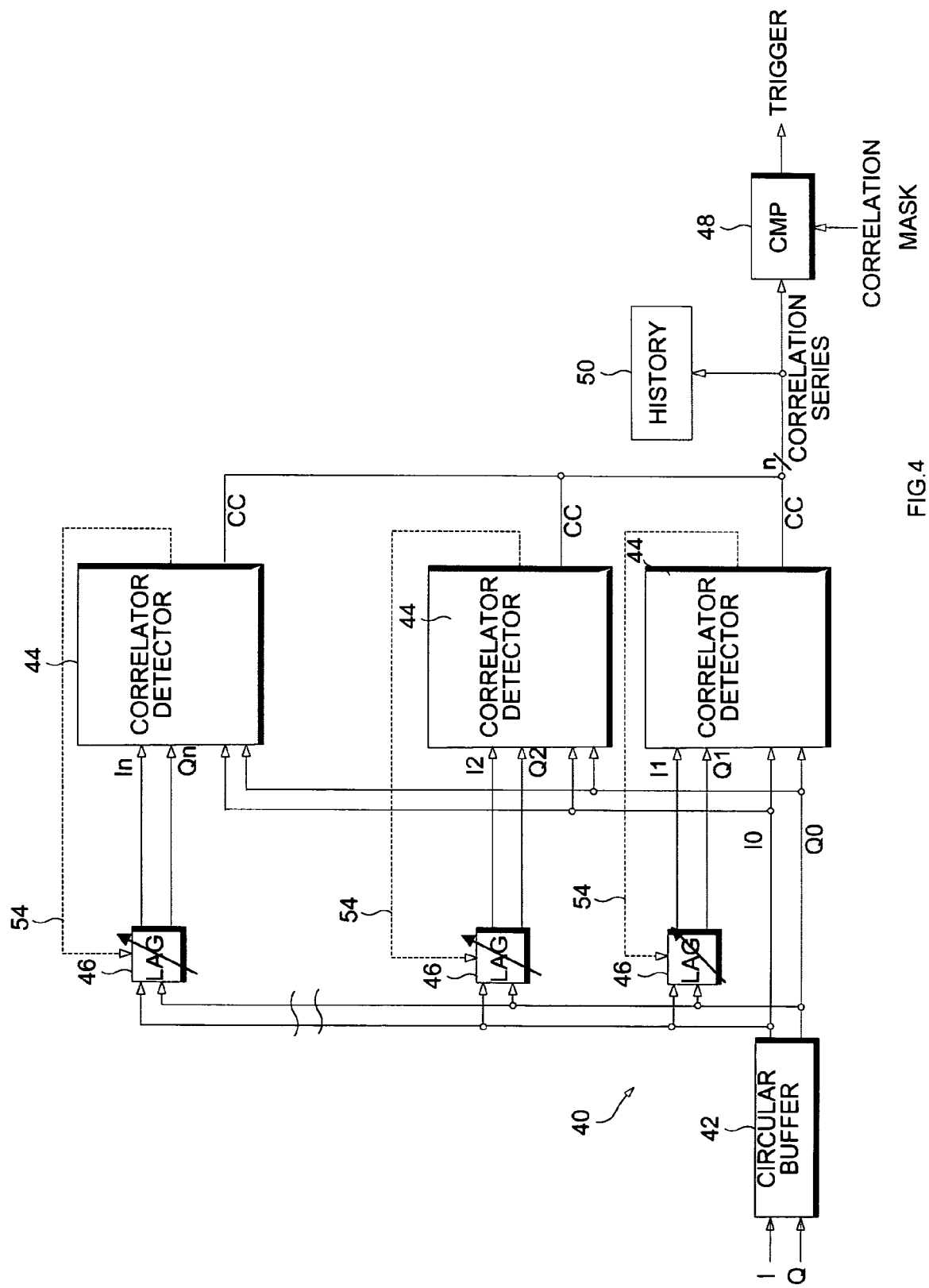
FIG. 4 illustrates an autocorrelation trigger.

FIG. 4 illustrates an alternative embodiment of the trigger generator 40 for generating a trigger based on multi-lag autocorrelation. Multiple correlator detectors 44 are provided in parallel along with corresponding lags 46. In a first embodiment, each correlator detector 44 produces a correlation coefficient (CC). The correlation coefficients are then combined to produce a correlation series for comparison using the comparator 48.

In an alternative embodiment, each correlator detector and lag pair includes a control path 54. This will allow each comparator detector to perform a series of multi-lag correlations to produce a correlation series. These correlation series would then be combined to produce a final correlation series for use in the comparator 48.

In the previous description the various components of the trigger generator 40 have been discussed as separate components. In some embodiments for the present trigger generator, the comparator detector 44, the lag 46 and the comparator 48 are implemented using a single component. All three operations could be performed by different portions of an FPGA, or ASIC. In alternative embodiments, all three operations could be performed within software running on a single CPU, or other general purpose processor, or a single DSP. The history 50 could be provided within the same device, or as a separate memory or buffer.

Embodiments of trigger generator 40 may be incorporated into a measurement instrument to provide additional functionality to the instrument. When coupled to a spectrum analyzer receiver system the autocorrelation signal trigger can operate over a large frequency range with very high sensitivity and dynamic range, but with limited bandwidth. Alternatively, when coupled to an oscilliscope the autocorrelation trigger can operate over a very large frequency bandwidth, but with lower dynamic range relative to spectrum analyzers It will be obvious to those having skill in the art that many changes may be made to the details of the above-described embodiments of this invention without departing from the underlying principles thereof. The scope of the present invention should, therefore, be determined by the following claims.

What is claimed is:

1. A measurement instrument for capturing signal data based upon an autocorrelation trigger comprising:
    a processor that provides a three-dimensional representation of frequency versus time versus amplitude to a monitor;
    a correlator detector for producing a correlation coefficient by correlating a signal with a time-delayed version of the signal;
    a lag generator providing the time-delayed version of the signal to the correlator detector;
    a comparator connected to the correlator detector for producing a trigger when a correlation condition is satisfied; and
    an acquisition memory to hold information related to the signal in response to the trigger signal;
    wherein the comparator comprises a correlator for correlating a correlation series, which comprises a series of correlation coefficients, with a correlation map to determine whether the correlation condition is satisfied.

2. A method of generating an autocorrelation trigger comprising:
    correlating a signal with a time-delayed version of the signal to produce a correlation coefficient;
    comparing the correlation coefficient with a correlation threshold to determine a correlation condition;
    generating a trigger signal when the correlation condition is satisfied;
    holding information related to the signal in response to the trigger signal; and
    displaying a spectrogram based upon the information related to the signal;
    wherein comparing the correlation coefficient with a correlation threshold further comprises comparing a series of correlation coefficients against a correlation mask, which comprises at least one correlation threshold, to determine the correlation condition based-upon a comparison with an autocorrelation model.

3. The method of 2, wherein the autocorrelation model is a randomness model.

4. The method of claim 2, wherein the autocorrelation model is a sinusoidal model.

5. The method of claim 2, wherein the autocorrelation model is a strong autocorrelation model.

6. The method of claim 2, wherein the autocorrelation models is a weak autocorrelation model.

7. A measurement instrument having an autocorrelation trigger generator comprising:
    a means for correlating a signal with a time-delayed version of the signal to produce a correlation coefficient in real-time;
    a means for delaying the signal to produce the time-delayed version of the signal for inputting into the means for correlating;
    a means for comparing the correlation coefficient with a correlation threshold to determine a correlation condition in real-time;

a means for generating a trigger signal in real-time when the correlation condition is satisfied;

means for holding information related to the signal in response to the trigger signal;

means for displaying a spectrum based on the information related to the signal;

wherein the means for comparing the correlation coefficient against a correlation threshold comprises a means for comparing a correlation series against a correlation mask.

* * * * *